United States Patent
de Bock et al.

(10) Patent No.: US 10,276,512 B2
(45) Date of Patent: Apr. 30, 2019

(54) SYSTEM AND METHOD FOR POWER ELECTRONICS WITH A HIGH AND LOW TEMPERATURE ZONE COOLING SYSTEM

(71) Applicant: General Electric Company, Schenectady, NY (US)

(72) Inventors: Hendrik Pieter Jacobus de Bock, Clifton Park, NY (US); Joseph Lucian Smolenski, Slingerlands, NY (US)

(73) Assignee: General Electric Company, Schenectady, NY (US)

( * ) Notice: Subject to any disclaimer, the term of this patent is extended or adjusted under 35 U.S.C. 154(b) by 26 days.

(21) Appl. No.: 15/614,120

(22) Filed: Jun. 5, 2017

(65) Prior Publication Data
US 2018/0348831 A1    Dec. 6, 2018

(51) Int. Cl.
*G06F 1/20* (2006.01)
*H01L 23/46* (2006.01)
(Continued)

(52) U.S. Cl.
CPC .............. *H01L 23/556* (2013.01); *G06F 1/20* (2013.01); *H01L 23/4006* (2013.01);
(Continued)

(58) Field of Classification Search
CPC ........ H05K 7/1432; H05K 7/209; H05K 7/20; H05K 7/20254; H05K 7/2089;
(Continued)

(56) References Cited

U.S. PATENT DOCUMENTS

| 5,801,442 | A |   | 9/1998 | Hamilton et al. |
| 6,060,772 | A | * | 5/2000 | Sugawara ............. H01L 25/162 |
| | | | | 257/678 |

(Continued)

OTHER PUBLICATIONS

Stefanskyi et al., "Silicon carbide power electronics for electric vehicles", 2015 Tenth International Conference on Ecological Vehicles and Renewable Energies (EVER), Mar. 31-Apr. 2, 2015.

(Continued)

*Primary Examiner* — James Wu
*Assistant Examiner* — Michael A Matey
(74) *Attorney, Agent, or Firm* — GE Global Patent Operation; Nitin Joshi

(57) ABSTRACT

A power electronics system is provided. The system includes at least one outer wall defining an outer zone including a plurality of first electronic components having a first normal operating maximum temperature and capable of generating electromagnetic fields. The system further includes at least one inner wall defining an inner zone disposed within the outer zone and including a plurality of second electronic components having a second normal operating maximum temperature, the first normal operating maximum temperature higher than the second normal operating maximum temperature, the inner zone substantially electromagnetically sealed against electromagnetic interference generated by the plurality of first electronic components. The system further includes a heat transfer assembly coupled to the at least one inner wall and configured to facilitate operating the plurality of second electronic components below the second normal operating maximum temperature by transferring heat from the inner zone to the outer zone.

24 Claims, 2 Drawing Sheets

(51) Int. Cl.
*H01L 23/556* (2006.01)
*H01L 23/40* (2006.01)
*H01L 23/473* (2006.01)
*H01L 23/38* (2006.01)
*H01L 23/427* (2006.01)

(52) U.S. Cl.
CPC ............ *H01L 23/473* (2013.01); *H01L 23/38* (2013.01); *H01L 23/427* (2013.01)

(58) Field of Classification Search
CPC ........ H05K 5/0026; H05K 7/02; H05K 13/00; H05K 2201/10166; H05K 3/0061; H05K 7/20218; H05K 7/20854; H05K 13/04; H05K 1/0203; H05K 1/0204; H05K 1/181; H05K 2201/066; H05K 7/1427; H05K 7/20963; G06F 1/188; G06F 1/20
See application file for complete search history.

(56) References Cited

U.S. PATENT DOCUMENTS

| | | | |
|---|---|---|---|
| 6,141,219 A | 10/2000 | Downing et al. | |
| 6,313,991 B1 | 11/2001 | Nagashima et al. | |
| 6,473,303 B2 | 10/2002 | Kaufmann | |
| 7,061,775 B2 | 6/2006 | Beihoff et al. | |
| 7,113,399 B2 | 9/2006 | Hisano et al. | |
| 7,679,923 B2* | 3/2010 | Inagaki | H05K 3/284 |
| | | | 174/521 |
| 8,376,069 B2* | 2/2013 | Nakatsu | B60L 11/00 |
| | | | 180/65.21 |
| 8,929,066 B2 | 1/2015 | Herman et al. | |
| 9,317,083 B2 | 4/2016 | Vyshetsky | |
| 9,570,643 B2 | 2/2017 | Myers et al. | |
| 9,980,415 B2* | 5/2018 | Zhou | H05K 7/20927 |
| 2003/0173059 A1* | 9/2003 | Edelmann | H05K 7/20454 |
| | | | 165/80.2 |
| 2006/0018098 A1* | 1/2006 | Hill | H05K 1/0204 |
| | | | 361/708 |
| 2010/0208427 A1* | 8/2010 | Horiuchi | H05K 7/20927 |
| | | | 361/699 |
| 2010/0277868 A1 | 11/2010 | Beaupre et al. | |
| 2013/0000871 A1 | 1/2013 | Olson et al. | |
| 2013/0223009 A1* | 8/2013 | Nakatsu | H02M 7/003 |
| | | | 361/699 |
| 2014/0254103 A1* | 9/2014 | Yoshimi | H05K 7/2089 |
| | | | 361/719 |
| 2015/0029674 A1* | 1/2015 | Ko | H05K 1/0204 |
| | | | 361/720 |
| 2016/0324039 A1* | 11/2016 | Souda | E02F 9/0866 |
| 2016/0365788 A1* | 12/2016 | Singh | B60L 11/18 |

OTHER PUBLICATIONS

Biela et al., "Thermoelectric Cooling for Power Density Maximisation of Power Electronic Converters", Power electronic systems laboratory.

\* cited by examiner

SYSTEM AND METHOD FOR POWER ELECTRONICS WITH A HIGH AND LOW TEMPERATURE ZONE COOLING SYSTEM

BACKGROUND

The subject matter described herein relates generally to an electronics system and, more particularly, to a cooling system for an electronics system.

Many modern power electronics systems include a printed circuit board on which at least one device (or other electronic component) is mounted. The printed circuit cards are typically mounted within a case that protects the printed circuit cards from external influences such as extreme temperature, moisture, debris, and electromagnetic interference (EMI). Moreover, each printed circuit card has a normal operating maximum temperature range. Operating the electronics outside of this range may adversely impact component life and/or normal operation. The lowest normal operating maximum temperature range of each of the components on a printed circuit card typically determines the normal operating maximum temperature of the entire printed circuit card. The normal operating maximum temperature of one printed circuit card may be different than the predetermined normal operating maximum temperature of another printed circuit card. As such, when the electronic system operates in an environment that has a temperature that exceeds the predetermined normal operating maximum temperature of one of the printed circuit cards within the electronic system, that printed circuit card may operate in a manner that is inconsistent with normal operations.

BRIEF DESCRIPTION

In one aspect, a power electronics system is provided. The system includes at least one outer wall defining an outer zone, the outer zone including a plurality of first electronic components, the plurality of first electronic components having a first normal operating maximum temperature and capable of generating electromagnetic fields. The system further includes at least one inner wall defining an inner zone, the inner zone disposed within the outer zone, the inner zone including a plurality of second electronic components, the plurality of second electronic components having a second normal operating maximum temperature, the first normal operating maximum temperature higher than the second normal operating maximum temperature, the inner zone substantially electromagnetically sealed against electromagnetic interference generated by the plurality of first electronic components. The system further includes a heat transfer assembly coupled to the at least one inner wall, wherein the heat transfer assembly is configured to facilitate operating the plurality of second electronic components below the second normal operating maximum temperature by transferring heat from the inner zone to the outer zone.

In another aspect, a power electronics system is provided. The power electronics system includes at least one outer wall defining an outer zone, the outer zone including a plurality of first electronic components, the plurality of first electronic components having a first normal operating maximum temperature and capable of generating electromagnetic fields. The system further includes a plurality of inner walls defining a plurality of inner zones, each inner zone of the plurality of inner zones disposed within the outer zone, each inner zone of the plurality of inner zones including a plurality of second electronic components, the plurality of second electronic components having a second normal operating maximum temperature, the first normal operating maximum temperature higher than the second normal operating maximum temperature, each inner zone substantially electromagnetically sealed against electromagnetic interference generated by the plurality of first electronic components. The system further includes a plurality of heat transfer assemblies coupled to the plurality of inner walls, each heat transfer assembly of the plurality of heat transfer assemblies configured to cool an inner zone of the plurality of inner zones, wherein the plurality of heat transfer assemblies are configured to facilitate operating the plurality of second electronic components below the second normal operating maximum temperature by transferring heat from the plurality of inner zones to the outer zone.

In yet another aspect, a method of manufacturing a power electronics system is provided. The method includes providing an outer casing, the outer casing including a plurality of outer walls defining an outer zone, placing at least one first electronic component within the outer zone, the at least one first electronic component having a first normal operating maximum temperature, placing an inner casing within the outer zone, the inner casing including a plurality of inner walls defining an inner zone, placing at least one second electronic component within the inner zone, the at least one second electronic component having a second normal operating maximum temperature less than the first normal operating maximum temperature, and coupling at least one heat transfer assembly to at least one inner wall of the plurality of inner walls, the at least one heat transfer assembly configured to transfer heat from the inner zone to the outer zone.

DRAWINGS

These and other features, aspects, and advantages of the present disclosure will become better understood when the following detailed description is read with reference to the accompanying drawings in which like characters represent like parts throughout the drawings, wherein.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "substantially," and "approximately," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

The electronic systems described herein include an outer zone including a plurality of first electronic components, the plurality of first electronic components having a first normal operating maximum temperature. The systems described herein further include an inner zone disposed within the outer zone and including a plurality of second electronic components, the plurality of second electronic components having a second normal operating maximum temperature. The first normal operating maximum temperature is higher than the second normal operating maximum temperature. A heat transfer assembly transfers heat from the inner zone to the outer zone to facilitate operating the plurality of second operating components below the second normal operating maximum temperature.

Figure 1:
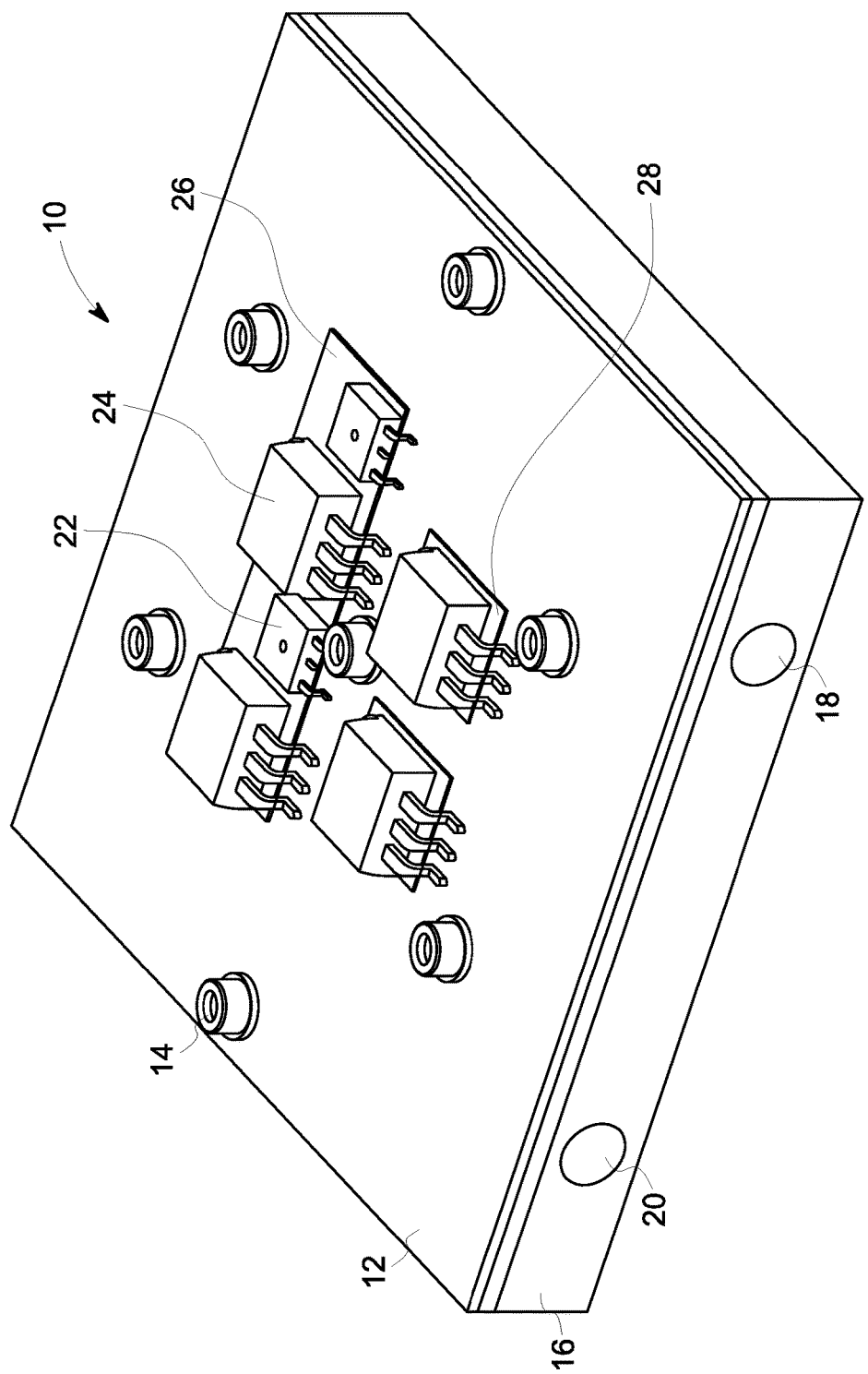
FIG. 1 is a perspective view of an exemplary power electronics module.

FIG. 1 is a perspective view of an exemplary power electronics module 10. In the exemplary embodiment, power electronics module 10 includes an insulated metal substrate (IMS) 12 and a heatsink 16. Power electronics module 10 also includes one or more TO-252 power semiconductors 22 and one or more TO-263 power semiconductors 24. The power semiconductors 22, 24 are bonded to corresponding thermal vias 26, 28 integrated into the IMS 12.

A plurality of fasteners 14 assists in aligning and securing the IMS 12 to heatsink 16. Heatsink 16 includes a cooling fluid inlet port 18 and a cooling fluid outlet port 20. In the exemplary embodiment, heatsink 16 is attached via pressurized sealing to a metal base layer of IMS 12. The metal base layer may consist of, without limitation, copper, aluminum, other metals, or plastic. Those of skill in the art will appreciate that power electronics module 10 is only one example of a power electronics module. Further, those of skill in the art will appreciate that the systems and methods described herein may be implemented in any suitable power electronics module and/or architecture.

Figure 2:
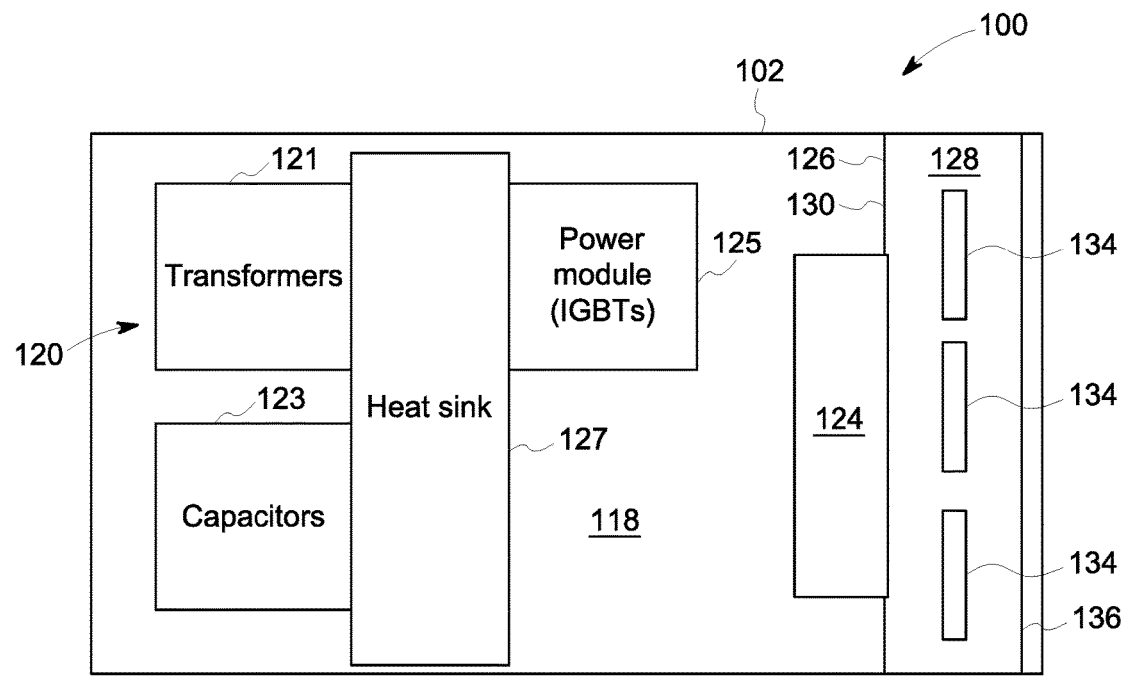
FIG. 2 is schematic diagram of an exemplary power electronics system.

FIG. 2 is a schematic diagram of an exemplary power electronics system 100 that may include, for example, power electronics module 10 (shown in FIG. 1). Power electronics module includes at least one outer wall forming an outer casing 102 that defines a first zone or outer zone 118 that houses multiple power electronics components, as described herein. A plurality of first electronic components 120 are positioned within first zone 118. In the exemplary embodiment, first electronics components 120 include at least one transformer 121, at least one capacitor 123, and at least one power conversion module 125 (e.g., including IGBTs) coupled to a heat sink 127. Alternatively, first zone 118 may include any number and type of first electronic components 120 that enable power electronics system 100 to operate as described herein.

In the exemplary embodiment, power electronics system 100 further includes a heat transfer assembly 124 and an inner zone casing 126. Inner zone casing 126 defines a second zone or inner zone 128. Heat transfer assembly 124 is coupled to an outer surface 130 of inner zone casing 126. A plurality of second electronic components 134 are positioned within inner zone 128. In the illustrated embodiment, three second electronic components 134 are positioned within inner zone 128. Further, in the exemplary embodiment, second electronic components 134 are input/output or control circuit cards. Alternatively, inner zone 128 includes any number and type of second electronic components 134 that enable power electronics system 100 to operate as described herein.

In the exemplary embodiment, power electronics system 100 includes a single inner zone casing 126 housing second electronic components 134. Alternatively, power electronics system 100 may include multiple inner zone casing 126, each having one or more second electronic components 134. Further, electronic components in each inner zone casing 126 may have different associated normal operating maximum temperatures, as described herein. Including multiple inner zone casings 126 within power electronics system 100 facilitates power electronics system 100 operating multiple types of electronic components within a single unit. Specifically, multiple inner zone casings 126 power electronics system 100 operating electronic components at multiple different normal operating maximum temperatures.

In the exemplary embodiment, first electronic components 120 are silicon carbide components having a first normal operating maximum temperature. In another embodiment, first electronic components 120 are gallium nitride components having a first normal operating maximum temperature. First electronic components 120 may also be silicon components (e.g., in a high temperature rated package) having a first normal operating maximum temperature. Second electronic components 134 include silicon components having a second normal operating maximum temperature. In the exemplary embodiment, silicon carbide components, silicon components, and/or gallium nitride components that constitute first electronic components 120 are configured to operate at higher temperatures than silicon components that constitute second electronic components 134. As such, the first normal operating maximum temperature is generally higher than the second normal operating maximum temperature. Additionally, high speed switching of silicon carbide components, silicon components, and/or gallium nitride components that constitute first electronic components 120 typically generates Electromagnetic Interference (EMI) that interferes with other electrical components. As such, EMI from first electronic components 120 may interfere with the operation of second electronic components 134.

In the exemplary embodiment, outer casing 102 and inner zone casing 126 are aluminum. In alternative embodiments, outer casing 102 and inner zone casing 126 are any material that enables electronic system 100 to operate as described herein. For example, in some embodiments, outer casing 102 and inner zone casing 126 include any of the following materials, without limitation: magnesium, reinforced polymer composites, copper, titanium, and combinations thereof.

In the exemplary embodiment, inner zone casing 126 is a cuboid. In particular, inner zone casing 126 includes a plurality of inner planar walls 136 that are rectangular and are substantially orthogonal to each other. Accordingly, inner zone casing 126 is a rectangular cuboid. In alternative embodiments, inner zone casing 126 is any shape that enables power electronics system 100 to operate as described herein. In the exemplary embodiment, inner zone casing 126 effectively forms an electromagnetic barrier around second electronic components 134. As a result, inner zone casing 126 reduces EMI interference for second electronic components 134 from the environment and first electronic components 120. Additionally, in some embodiments, an insulation layer (not shown) may extend about inner zone casing 126 to insulate inner zone casing 126, inner zone 128, and second electronic components 134 from the environment within outer zone 118 and the environment outside of outer casing 102.

In the exemplary embodiment, heat transfer assembly 124 is coupled to outer surface 130 of inner zone casing 126. In alternative embodiments, heat transfer assembly 124 is coupled to inner zone casing 126 in any manner that enables power electronics system 100 to operate as described herein. In the exemplary embodiment, heat transfer assembly 124 is contoured to thermally connect with inner zone casing 126 and improve the efficiency of heat transfer. In the exemplary embodiment, heat transfer assembly 124 includes a heat pump configured to transfer heat from inner zone 128 to outer zone 118. In alternative embodiments, electronics system 100 includes any heat transfer assembly 124 that enables electronic system 100 to operate as described herein. For example, in some embodiments, heat transfer assembly 124 includes one or more of the following, including without limitation, a heat pipe, a heat sink, an electronic cooling system, a thermoelectric cooler, a solid conductor, a phase change material, a refrigeration system, a thermoionic system, and a convection cooling system. In further embodiments, heat transfer assembly 124 includes, without limitation, any of the following materials: aluminum, copper, magnesium, graphite, graphene, reinforced polymer composites, titanium, and combinations thereof.

In some embodiments, a plurality of contact members (not shown) are positioned between heat transfer assembly 124 and inner zone casing 126. Contact members (not shown) facilitate transfer of heat between heat transfer assembly 124 and inner zone casing 126. For example, in some embodiments, contact members (not shown) include any of the following, without limitation, thermal gel, thermal, grease, solder, and gap pads. In alternative embodiments, heat transfer assembly 124 includes any contact members (not shown) that enable heat transfer assembly 124 to operate as described herein.

Figure 3:
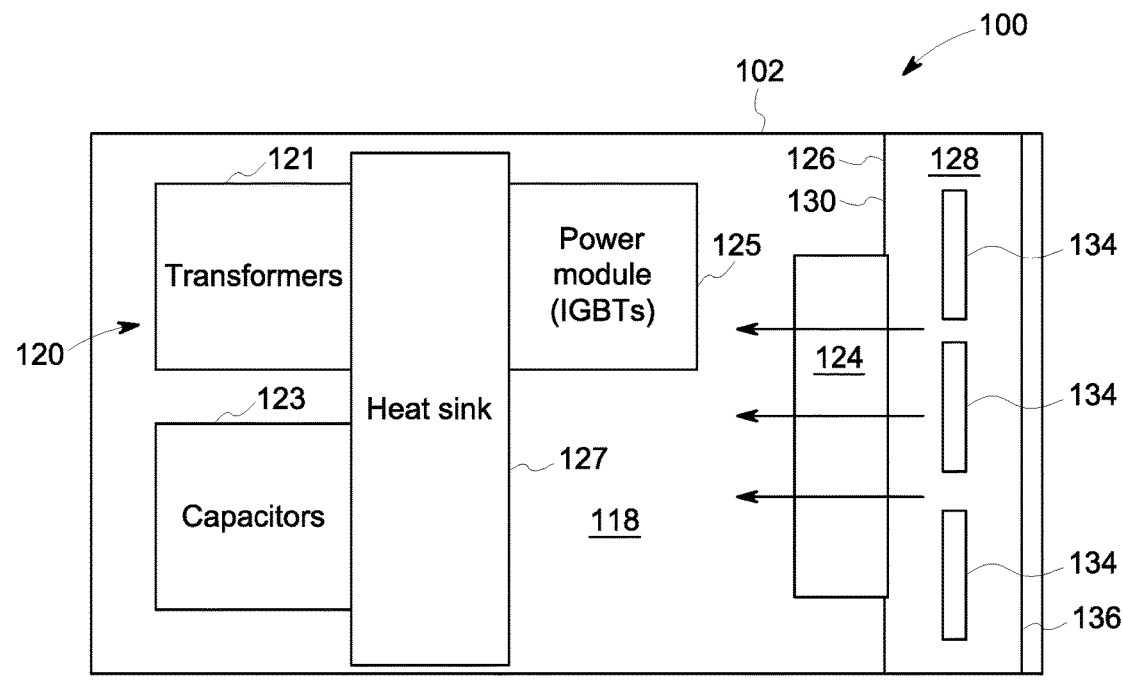
FIG. 3 is a schematic diagram showing heat flow through the power electronics system shown in FIG. 2.

FIG. 3 is a schematic diagram of power electronics system 100 showing heat flow through power electronics system 100. During operations, power electronics system 100 is placed in an environment that has a temperature that exceeds the second normal operating maximum temperature but not the first normal operating maximum temperature. Additionally, first and second electronic components 120 and 134 generate heat during operations. As such, a temperature within inner zone 128 and outer zone 118 raises. During operations, heat transfer assembly 124 removes heat generated by second electronic components 134 and by the environment from inner zone 128. In particular, heat transfer assembly 124 expels heat from inner zone 128 to outer zone 118 or directly to heat sink 127 (e.g., via a heat pipe). As such, in some embodiments, the temperature of inner zone 128 is reduced while the temperature of outer zone 118 is increased. In some embodiments, heat may be transferred out of outer zone 118 using heat sink 127, which may be similar to heatsink 16 (shown in FIG. 1). Heat transfer assembly 124 facilitates operating second electronic components 134 below the second normal operating maximum temperature, which allows second electronic components 134 to continue to operating in a predetermined manner. Additionally, the temperature of first electronic components 120 is increased, but not above the first normal operating maximum temperature. As such, the heat generated by the environment and by first and second electronic components 120 and 134 is transported from inner zone 128 to outer zone 118.

In some embodiments, power electronics system 100 may include one or more sensors (not shown) that manage operation of heat transfer assembly 124. For example, the sensors may monitor the temperature in inner zone 128 and activate heat transfer assembly 124 when a threshold temperature is reached. The sensors may be positioned in inner zone 128 and may, in some embodiments, be included in second electronic components 134. The threshold temperature may be less than the second normal operating maximum temperature, or may be equal to the second normal operating maximum temperature. Alternatively, heat transfer assembly 124 may operate in a passive or open loop manner.

In addition, in some embodiments, first electronic components 120 generate EMI that interferes with the operation of second electronic components 134. Inner zone casing 126 is configured to reduce the EMI from first electronic components 120 such that the EMI that reaches second electronic components 134 is reduced below a level that interferes with the operation of second electronic components 134.

In reference to FIGS. 2 and 3, a method of manufacturing power electronics system 100 includes providing outer casing 102. Outer casing 102 defines outer zone 118. The method also includes placing first electronic components 120 within outer zone 118. First electronic components 120 have a first normal operating maximum temperature. The method further includes placing inner zone casing 126 within outer zone 118. Inner zone casing 126 includes walls 136 that define inner zone 128. The method also includes placing second electronic components 134 within inner zone 128. Second electronic components 134 have a second normal operating maximum temperature that is less than the first normal operating maximum temperature. The method further includes coupling heat transfer assembly 124 to at least wall 136 of inner zone casing 126. Heat transfer assembly 124 is configured to transfer heat from inner zone 128 to outer zone 118.

The above described electronic systems are divided into a plurality of zones and include at least one heat transfer assembly. The zones each include one or more electronic components therein. The electronic components in a first, outer zone have a normal operating maximum temperature that is higher than the electronic components in a second, inner zone. The at least one heat transfer assembly transfer heats from the second zone to the first zone in order to maintain the temperature of the electronic components in the second zone below the normal operating maximum temperature for those components. As such, the heat transfer assemblies described herein transport heat to the zone that includes electronic components that are capable of maintaining operation with additional heat added to the zone they occupy. Moreover, a casing separates the zones from each other. The casing also protects the electronic components in the second zone from EMI generated by the electronic components in the first zone.

An exemplary technical effect of the methods, systems, and apparatus described herein includes at least one of: (a) increasing thermal performance of electronic systems; (b) decreasing the temperature of electronic components within an inner zone of an electronic system; and (c) reducing the EMI within an inner zone of an electronic system.

Exemplary embodiments of electronic systems that include heat transfer assemblies are described above in detail. The electronic systems, and methods of operating and manufacturing such systems and devices are not limited to the specific embodiments described herein, but rather, components of systems and/or steps of the methods may be utilized independently and separately from other components and/or steps described herein. For example, the methods may also be used in combination with other electronic system, and are not limited to practice with only the electronic systems, and methods as described herein. Rather, the exemplary embodiment can be implemented and utilized in connection with many other electronic systems.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A power electronics system comprising:
   at least one outer wall defining an outer zone, said outer zone comprising a plurality of first electronic components, said plurality of first electronic components having a first normal operating maximum temperature and capable of generating electromagnetic fields;
   at least one inner wall defining an inner zone, said inner zone disposed within said outer zone, said inner zone comprising a plurality of second electronic components, said plurality of second electronic components having a second normal operating maximum temperature, the first normal operating maximum temperature higher than the second normal operating maximum temperature, said inner zone substantially electromagnetically sealed against electromagnetic interference generated by said plurality of first electronic components; and
   a heat transfer assembly coupled to said at least one inner wall, wherein said heat transfer assembly is configured to facilitate operating said plurality of second electronic components below the second normal operating maximum temperature by transferring heat from said inner zone to said outer zone.

2. The power electronics system in accordance with claim 1, wherein said heat transfer assembly comprises a heat pump.

3. The power electronics system in accordance with claim 2, wherein said heat pump comprises a thermoelectric cooler.

4. The power electronics system in accordance with claim 2, wherein said heat pump comprises a refrigeration system.

5. The power electronics system in accordance with claim 2, wherein said heat pump comprises a thermoionic system.

6. The power electronics system in accordance with claim 1, wherein said plurality of first electronic components comprise at least one of silicon carbide components, silicon components, and gallium nitride components.

7. The power electronics system in accordance with claim 1, wherein said plurality of second electronic components comprise a plurality of silicon components.

8. The power electronics system in accordance with claim 1, further comprising an insulation layer that extends about said at least one inner wall to insulate said inner zone.

9. The power electronics system in accordance with claim 1, further comprising a sensor configured to:
   monitor a temperature within said inner zone; and
   activate said heat transfer assembly when the monitored temperature reaches a threshold temperature.

10. The power electronics system in accordance with claim 1 comprising a plurality of inner walls that are rectangular and are substantially orthogonal to each other.

11. The power electronics system in accordance with claim 1 wherein the inner zone is a rectangular cuboid.

12. The power electronics system in accordance with claim 1, wherein heat is transferred out of outer zone using a heat sink and the heat transfer assembly transfers heat from said inner zone to the heat sink.

13. A power electronics system comprising:
   at least one outer wall defining an outer zone, said outer zone comprising a plurality of first electronic components, said plurality of first electronic components having a first no operating maximum temperature and capable of generating electromagnetic fields;
   a plurality of inner walls defining a plurality of inner zones, each inner zone of said plurality of inner zones disposed within said outer zone, each inner zone of said plurality of inner zones comprising a plurality of second electronic components, said plurality of second electronic components having a second normal operating maximum temperature, the first normal operating maximum temperature higher than the second normal operating maximum temperature, each inner zone substantially electromagnetically sealed against electromagnetic interference generated by said plurality of first electronic components; and
   a plurality of heat transfer assemblies coupled to said plurality of inner walls, each heat transfer assembly of said plurality of heat transfer assemblies configured to cool an inner zone of said plurality of inner zones, wherein said plurality of heat transfer assemblies are configured to facilitate operating said plurality of second electronic components below the second normal operating maximum temperature by transferring heat from said plurality of inner zones to said outer zone.

14. The power electronics system in accordance with claim 13, wherein said plurality of heat transfer assemblies comprise a plurality of heat pumps.

15. The power electronics system in accordance with claim 14, wherein said plurality of heat pumps comprise a plurality of thermoelectric coolers.

16. The power electronics system in accordance with claim 13, wherein said plurality of first electronic components comprise at least one of silicon carbide components, silicon components, and gallium nitride components.

17. The power electronics system in accordance with claim 13, wherein said plurality of second electronic components comprise a plurality of silicon components.

18. The power electronics system in accordance with claim 13, further comprising a plurality of insulation layers that extend about said plurality of inner walls, said plurality of insulation layers configured to insulate said plurality of inner zones.

19. The power electronics system in accordance with claim 13, further comprising at least one sensor configured to:
- monitor a temperature within at least one of the plurality of inner zones; and
- activate a corresponding heat transfer assembly of the plurality of heat transfer assemblies when the monitored temperature reaches a threshold temperature.

20. A method of manufacturing a power electronics system, said method comprising:
- providing an outer casing, the outer casing including a plurality of outer walls defining an outer zone;
- placing at least one first electronic component within the outer zone, the at least one first electronic component having a first normal operating maximum temperature;
- placing an inner casing within the outer zone, the inner casing including a plurality of inner walls defining an inner zone;
- placing at least one second electronic component within the inner zone, the at least one second electronic component having a second normal operating maximum temperature less than the first normal operating maximum temperature; and
- coupling at least one heat transfer assembly to at least one inner wall of the plurality of inner walls, the at least one heat transfer assembly configured to transfer heat from the inner zone to the outer zone.

21. The method in accordance with claim 20, wherein placing at least one first electronic component within the outer zone comprises placing at least one of a silicon carbide component, a silicon component, and a gallium nitride component within the outer zone.

22. The method in accordance with claim 20, wherein coupling at least one heat transfer assembly to at least one inner wall of the plurality of inner walls comprises coupling at least one heat pump to at least one inner wall of the plurality of inner walls.

23. The method in accordance with claim 20, wherein coupling at least one heat transfer assembly to at least one inner wall of the plurality of inner walls comprises coupling at least one thermoelectric cooler to at least one inner wall of the plurality of inner walls.

24. The method in accordance with claim 20, further comprising coupling an insulation layer to the inner casing, the insulation layer configured to insulate the inner zone.

* * * * *